(12) United States Patent
Zheng (10) Patent No.: US 12,176,235 B2
(45) Date of Patent: Dec. 24, 2024

(54) INSTALLATION FIXTURE FOR NEEDLE AND INSTALLATION METHOD FOR NEEDLE

(71) Applicant: CHANGXIN MEMORY TECHNOLOGIES, INC., Hefei (CN)

(72) Inventor: Fencheng Zheng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/604,405

(22) PCT Filed: Jul. 19, 2021

(86) PCT No.: PCT/CN2021/107186
§ 371 (c)(1),
(2) Date: Jan. 12, 2023

(87) PCT Pub. No.: WO2023/279433
PCT Pub. Date: Jan. 12, 2023

(65) Prior Publication Data
US 2024/0021459 A1 Jan. 18, 2024

(30) Foreign Application Priority Data
Jul. 9, 2021 (CN) .......................... 202110780924.8

(51) Int. Cl.
*H01L 21/683* (2006.01)
*H01L 21/67* (2006.01)

(52) U.S. Cl.
CPC .... *H01L 21/6833* (2013.01); *H01L 21/67259* (2013.01)

(58) Field of Classification Search
CPC ........... H01L 21/6833; H01L 21/67259; H01L 21/6831; Y02P 70/50; B25B 27/00

USPC .......................................................... 361/234
See application file for complete search history.

(56) References Cited

U.S. PATENT DOCUMENTS

2007/0236857 A1* 10/2007 Lin ..................... H01L 21/6838
361/234
2012/0287552 A1* 11/2012 Shiraiwa ........... H01L 21/67109
361/234

FOREIGN PATENT DOCUMENTS

| CN | 205571611 U | 9/2016 |
|---|---|---|
| CN | 104975257 B | 4/2018 |
| CN | 209706698 U | 11/2019 |
| CN | 211761005 U | 10/2020 |
| CN | 212806851 U | 3/2021 |
| CN | 213616317 U | 7/2021 |
| CN | 213616347 U | 7/2021 |
| WO | 2021129053 A1 | 7/2021 |

OTHER PUBLICATIONS

International Search Report of PCT Application No. PCT/CN2021/107186 mailed Apr. 6, 2022.

* cited by examiner

*Primary Examiner* — Dharti H Patel
(74) *Attorney, Agent, or Firm* — Syncoda LLC; Feng Ma (57) ABSTRACT

An installation fixture for needle is used to install needles of an electrostatic chuck, and includes: a positioning tray, detachably disposed on an outer base of the electrostatic chuck, the positioning tray being provided with installation holes, and the installation holes corresponding to installation positions of the needles of the electrostatic chuck; and an installation fixture, detachably installed in the installation hole to adjust the installation depth of the needle.

15 Claims, 7 Drawing Sheets

INSTALLATION FIXTURE FOR NEEDLE AND INSTALLATION METHOD FOR NEEDLE

CROSS-REFERENCE TO RELATED APPLICATIONS

This application is a national stage of International Application No. PCT/CN2021/107186 filed on Jul. 19, 2021, which claims priority to Chinese Patent Application No. 202110780924.8 filed on Jul. 9, 2021. The disclosures of these applications are hereby incorporated by reference in their entirety.

TECHNICAL FIELD

The present disclosure relates to, but is not limited to, an installation fixture for needle and an installation method for needle.

BACKGROUND

During the manufacturing of a semiconductor wafer, when the semiconductor wafer is transferred to an electrostatic chuck, the semiconductor wafer is supported by needles disposed on the electrostatic chuck. During equipment maintenance, the needles of the electrostatic chuck will be removed or replaced, and manually reassembled and corrected. The needles with brittle texture are easily damaged during installation, and it is difficult to ensure that different needles are installed at the same height during manual measurement, so not only the efficiency is low, but also horizontal deviation of the wafer during picking and placement during subsequent operation will be caused, resulting in machining errors or scraps and even breakage of the wafer.

SUMMARY

The subject matter is described in detail herein below, which is not intended to limit the scope of protection of claims.

The present disclosure provides an installation fixture for needle and an installation method for needle, which can ensure uniform installation height of needles during installation and correction, improve the correction efficiency, reduce the risk of breakage, and improve the machining effect and yield of semiconductors.

The first aspect of the present disclosure provides an installation fixture for needle, the installation fixture for needle is used to install needles of an electrostatic chuck, and the installation fixture for needle includes:
  a positioning tray, detachably disposed on an outer base of the electrostatic chuck, the positioning tray being provided with installation holes, and the installation holes corresponding to installation positions of the needles of the electrostatic chuck; and
  an installation fixture, detachably installed in the installation hole to adjust the installation depth of the needle.

The second aspect of the present disclosure provides an installation method for needle, which is implemented using the installation fixture for needle described above, and the installation method for needle includes:
  installing the positioning tray on the outer base of the electrostatic chuck; and
  adjusting the installation height of the installation fixture to a preset value, and placing the installation fixture in an installation hole of the positioning tray to install a needle.

The installation fixture for needle according to the embodiments of the present disclosure is used to install the needles of the electrostatic chuck, ensures the smooth installation and installation efficiency of the needles, can accurately adjust the installation depths of the needles, ensures the consistency of the installation depths of the needles, ensures the position stability of a semiconductor device supported by the needles, avoids machining errors or scraps, and improves the yield of production.

After the drawings and detailed description are read and understood, other aspects may be understood.

BRIEF DESCRIPTION OF THE DRAWINGS

The drawings, which are incorporated in and constitute a part of the specification, illustrate embodiments of the present disclosure and together with the description serve to explain the principles of the embodiments of the present disclosure. In these drawings, similar reference numerals are used for representing similar elements. The drawings in the following description are only some rather than all of the embodiments of the present disclosure. Those skilled in the art would be able to derive other drawings from these drawings without any creative efforts.

REFERENCE NUMERALS

100—electrostatic chuck; 101—outer base; 102—positioning pin; 200—needle;
1—positioning tray; 11—installation hole; 111—first part; 112—second part; 12—positioning hole; 13—orientation mark; 2—installation fixture; 21—measuring device; 210—through hole; 211—measuring rod; 211a—slide rail; 211b—chute; 212—measuring block; 213—scale line; 214—jack screw; 215—positioning bolt; 22—pressing rod; 221—handle.

DETAILED DESCRIPTION

A clear and complete description will be made to the technical solutions in the embodiments of the present disclosure below in combination with the drawings in the embodiments of the present disclosure. Apparently, the embodiments described are part of the embodiments of the present disclosure, not all of them. All other embodiments obtained by those skilled in the art based on the embodiments of the present disclosure without any creative efforts shall fall within the protection scope of the present disclosure. It should be noted that the embodiments in the present disclosure and the features in the embodiments can be combined with each other on a non-conflict basis.

The present disclosure provides an installation fixture for needle and installation method, which are used to install needles of an electrostatic chuck, and also improve the installation accuracy and efficiency of the needles, in which a positioning tray is used to ensure the accuracy of needle installation positions, and a height adjustable installation fixture is used to ensure uniform installation depths of the needles, thereby ensuring the position stability of a semiconductor device supported by the needles, ensuring machining stability and accuracy, avoiding machining errors or even scraps due to non-uniform installation depths of the needles, and improving the yield.

Figure 1:
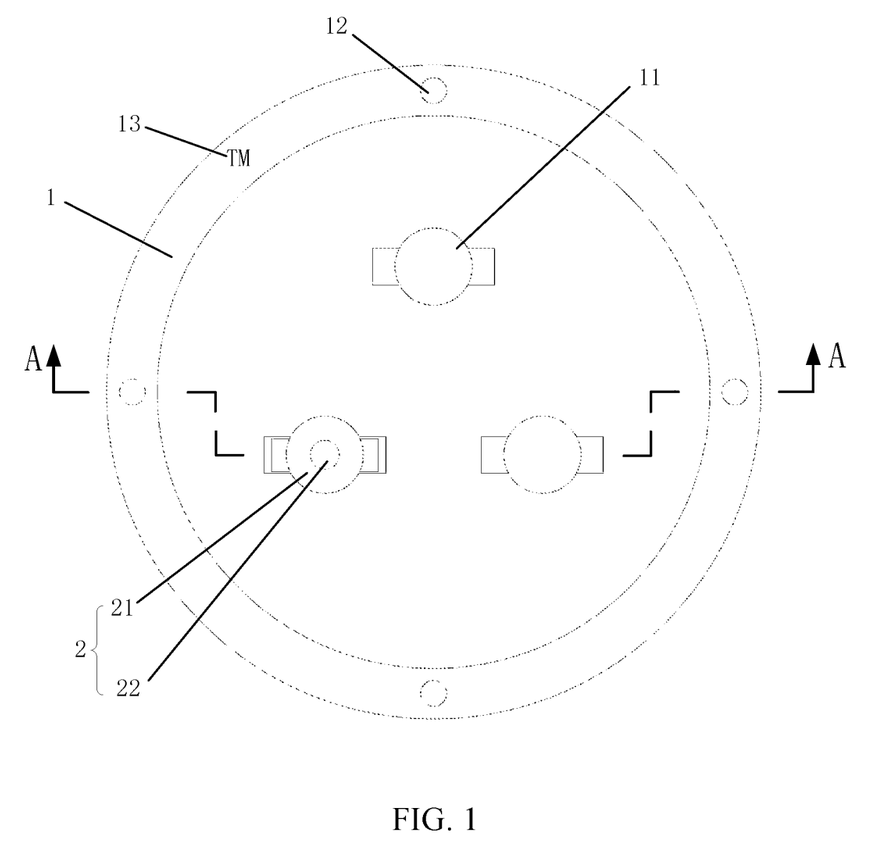
FIG. 1 is a schematic structure diagram of an installation fixture for needle according to an exemplary embodiment.
Figure 2:
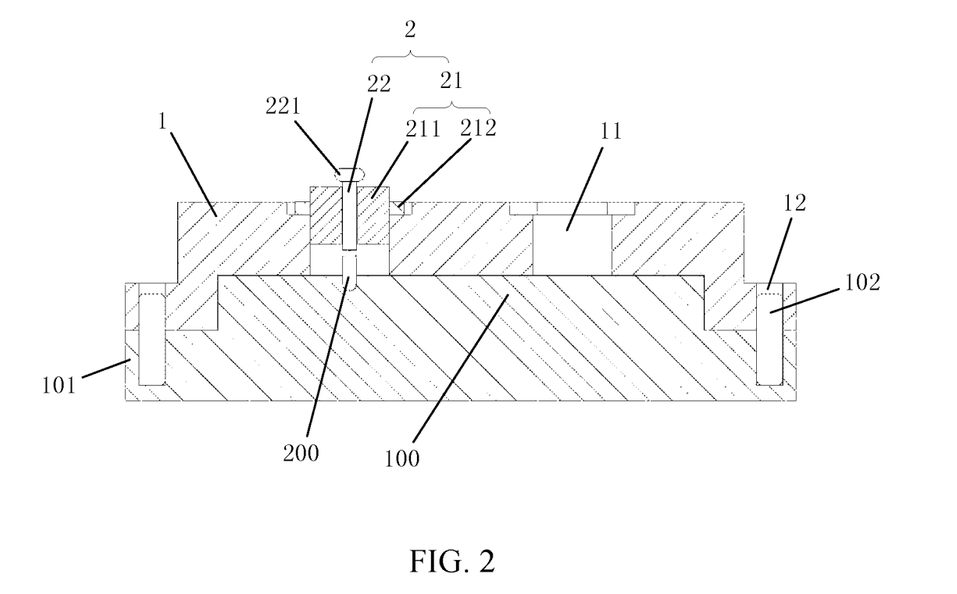
FIG. 2 is a cross-sectional view of A-A in FIG. 1 according to an exemplary embodiment.

FIG. 1 shows a schematic structure diagram of an installation fixture for needle according to an embodiment of the present disclosure, and FIG. 2 is a cross-sectional view of A-A in FIG. 1. The following describes the installation fixture for needle and the installation method for needle proposed in the present disclosure with reference to the accompanying drawings and specific embodiments.

Referring to FIGS. 1 and 2, the installation fixture for needle described in the present disclosure is used to install needles 200 on an electrostatic chuck 100. The installation fixture for needle includes a positioning tray 1 and an installation fixture 2. The installation fixture 2 is used to install the needles 200 to ensure safe and accurate installation of the needles 200, and to ensure that the installation depth of each needle 200 is the same, so as to ensure installation consistency of the needles 200. The positioning tray 1 is used to position the installation fixture 2 to ensure accurate installation of the needles 200 by the installation fixture 2.

In some embodiments, the positioning tray 1 is detachably disposed on an outer base 101 of the electrostatic chuck 100, and the positioning tray 1 is provided with installation holes 11. The number of the installation holes 11 is the same as that of the needles 200 to be installed on the electrostatic chuck 100, and the positions of the installation holes 11 correspond to the installation positions of the needles 200 on the electrostatic chuck 100 one to one.

In practical applications, the installation fixture 2 is detachably installed in the installation hole 11 to adjust the installation depth of the needle 200. The operation process may be as follows: the positioning tray 1 is first fixed to the outer base 101 of the electrostatic chuck 100 in a predetermined direction, then the installation fixture 2 is placed in an installation hole 11 to adjust the installation depth of the installation fixture 2 to a predetermined depth position, a predetermined number of needles 200 are respectively placed at predetermined installation positions, and the installation fixture 2 is placed on each installation hole 11 to install the needle 200 corresponding to each installation hole 11 with a fixed depth one by one.

In the present disclosure, the installation fixture 2 mainly implements the accurate installation of the needles 200 by means of fixed depth pressing. The installation fixture 2 includes a measuring device 21 and a pressing rod 22, wherein the measuring device 21 is used to accurately adjust the pressing depth of the pressing rod 22 and thereby adjust the pressing depth of the needle 200.

In some optional embodiments, the measuring device 21 is detachably installed in the installation hole 11 to accurately measure the press installation depth of the pressing rod 22 against the needle 200.

Figure 3:
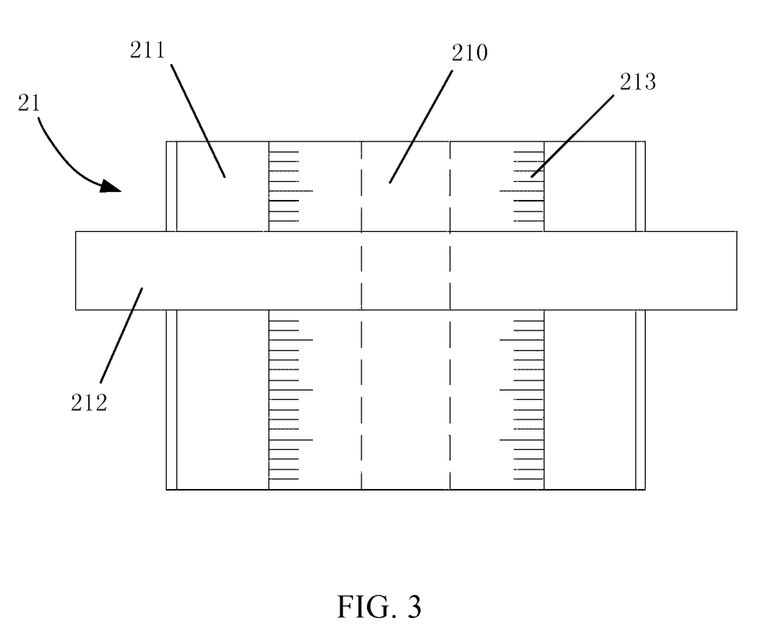
FIG. 3 is a schematic lateral structure diagram of an installation fixture according to an exemplary embodiment.

FIG. 3 shows a schematic lateral structure diagram of the measuring device 21 in an embodiment. Referring to FIGS. 2 and 3, the measuring device 21 includes a through hole 210, the pressing rod 22 is configured in the through hole 210, and the needle 200 is pressed and installed via the through hole 210. The installation depth of the needle 200 is adjusted according to the height of the pressing rod 22 and the relative height between the pressing rod 22 and the measuring device 21.

In some embodiments of the present disclosure, the measuring device 21 includes a measuring rod 211 and a measuring block 212, wherein the measuring rod 211 includes a through hole 210. The measuring rod 211 is detachably installed in the installation hole 11, and the measuring block 212 is connected with the measuring rod 211 in a transmission way. The relative position between the measuring block 212 and the measuring rod 211 is adjusted to adjust the relative height between the pressing rod 22 and the measuring device 21.

Figure 4:
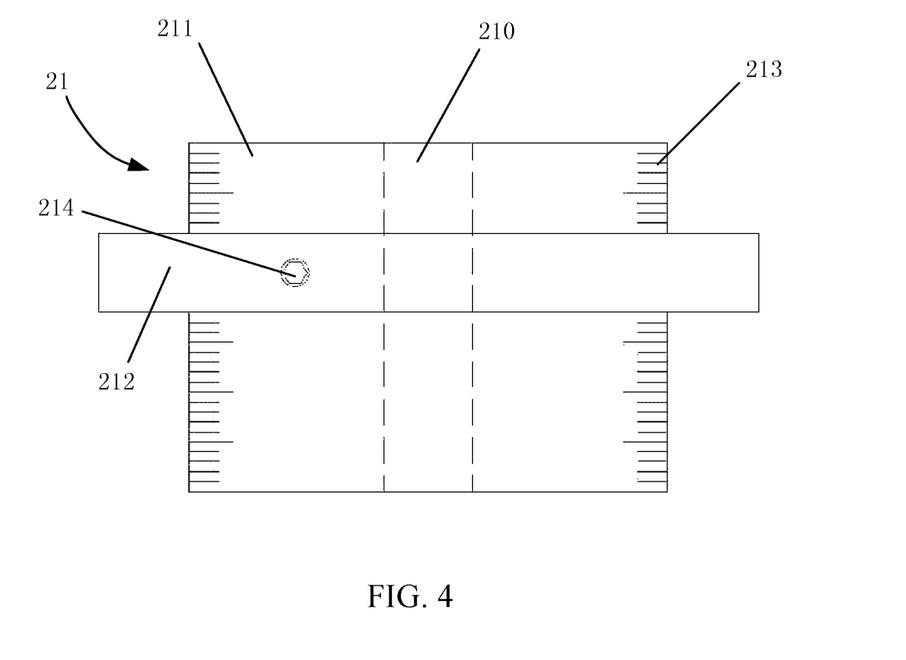
FIG. 4 is a schematic lateral structure diagram of an installation fixture according to an exemplary embodiment.
Figure 5:
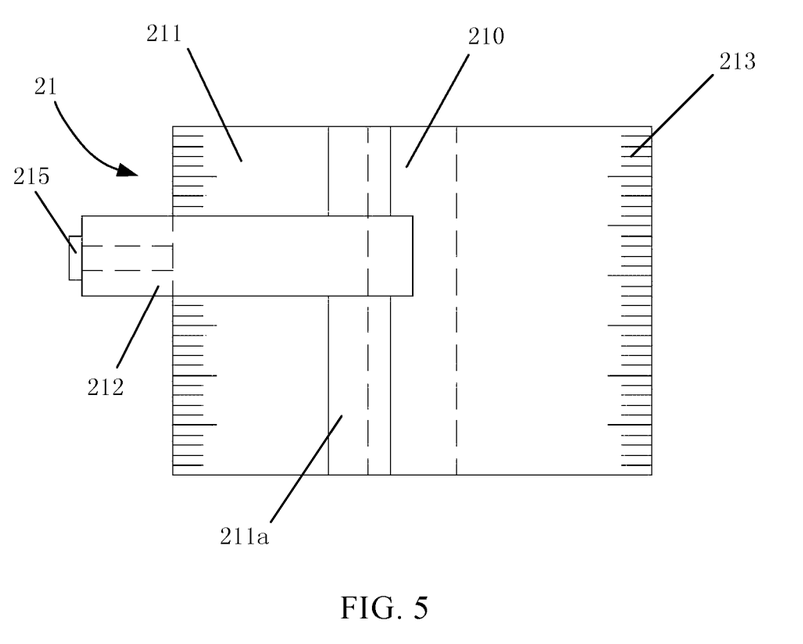
FIG. 5 is a schematic lateral structure diagram of an installation fixture according to an exemplary embodiment.
Figure 6:
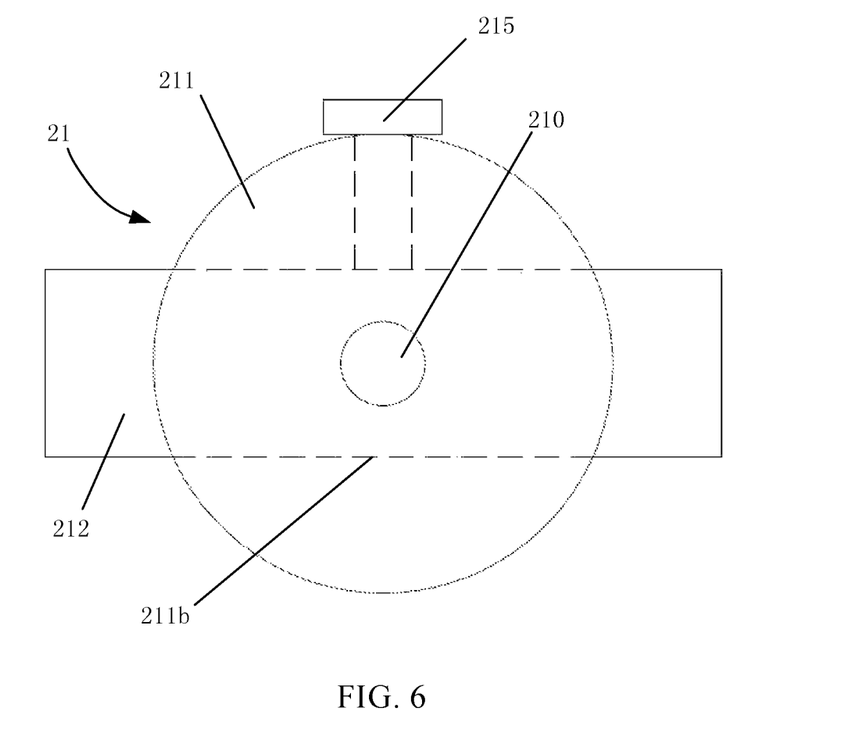
FIG. 6 is a schematic overlooked structure diagram of the installation fixture according to an exemplary embodiment.

Exemplarily, a combination structure of a slide block and a slide rail may be used between the measuring block 212 and the measuring rod 211, and the measuring block 212 and the measuring rod 211 are adjusted and limited by a jack screw or a positioning bolt. FIGS. 4 and 5 respectively show a schematic lateral structure diagram of the measuring device 21 in an embodiment, and FIG. 6 is a schematic overlooked structure diagram of the measuring device 21 in an embodiment. For example, in the embodiment shown in FIG. 4, the measuring block 212 is sleeved on the measuring rod 211 and connected to the measuring rod 211 in a sliding manner, and a jack screw 214 passes through the measuring block 212 and is tightly connected to the measuring rod 211 to adjust and fix the relative position between the measuring block 212 and the measuring rod 211. In the embodiment shown in FIG. 5, a slide rail 211a is disposed on one side of the measuring rod 211, the measuring block 212 is connected to the measuring rod 211 in a sliding manner through the slide rail 211a, and a positioning bolt 215 passes through the measuring block 212 and is tightly connected to the measuring rod 211, so as to fix the measuring block 212 to a predetermined position of the measuring rod 211.

For another example, in the embodiment shown in FIG. 6, a chute 211b penetrating the measuring rod 211 is disposed in the middle of the measuring rod 211, the length extension direction of the chute 211b is the same as that of the measuring rod 211, the measuring block 212 passes through the chute 211b and is connected to the measuring rod 211 in a sliding manner through the chute 211b, meanwhile, the positioning bolt 215 passes through one side of the measuring rod 211 and is tightly connected to the measuring block 212. The measuring block 212 is moved in the chute 211b and fixed by the positioning bolt 215, to adjust the relative position between the measuring block 212 and the measuring rod 211, thereby adjusting the measuring depth of the measuring device 21 and achieving the purpose of adjusting the installation depth of the needle 200. It should be pointed out that, in the embodiment shown in FIG. 6, the through hole 210 is not only formed in the measuring rod 211, but also penetrates the measuring block 212, so as to ensure that the pressing rod 22 will not be affected by the measuring block 212, achieve the purpose of adjusting the pressing depth of the pressing rod 22, and ensure that the pressing rod 22 completes the press installation of the needle 200.

The structure of the measuring device 21 of the embodiment shown in FIG. 3 or 4 is used in the embodiment shown in FIG. 2. In this embodiment, the measuring block 212 is sleeved on the measuring rod 211, and the outer diameter of the measuring block 212 is greater than the diameter of the installation hole 11. The depth of the measuring rod 211 extending into the installation hole 11 can be controlled by the measuring block 212, so as to control the pressing depth of the pressing rod 22, that is, control the installation depth of the needle 200.

In the present disclosure, the outer diameter of the pressing rod 22 matches the diameter of the through hole 210, and the outer diameter of the pressing rod 22 is greater than or equal to the outer diameter of the needle 200, to ensure safe installing of the needle 200 and avoid crushing of the needle 200 during installation. Exemplarily, the center axis of the pressing rod 22 during pressing is on the same straight line as the center axis of the needle 200, so as to ensure safe and smooth installation of the needle 200.

In order to accurately adjust of the pressing depth of the pressing rod 22, that is, accurately adjust the installation depth of the needle 200, the measuring rod 211 is provided with scale lines 213 in the present disclosure. The relative position between the measuring rod 211 and the measuring block 212 can be accurately adjusted according to the scale lines 213, so as to achieve the purpose of accurately adjusting the installation depth of the needle 200.

In an alternative embodiment, as shown in FIG. 3, the measuring rod 211 may be optionally a screw, and the measuring block 212 may be a nut. One side or two opposite sides of the measuring rod 211 may be a plane(s), on which the scale lines 213 are distributed in the length extension direction of the measuring rod 211, so as to achieve the purpose of adjusting the relative position between the measuring rod 211 and the measuring block 212 by rotating the screw or nut, adjust the pressing depth of the pressing rod 22, and adjust the installation depth of the needle 200.

Figure 7:
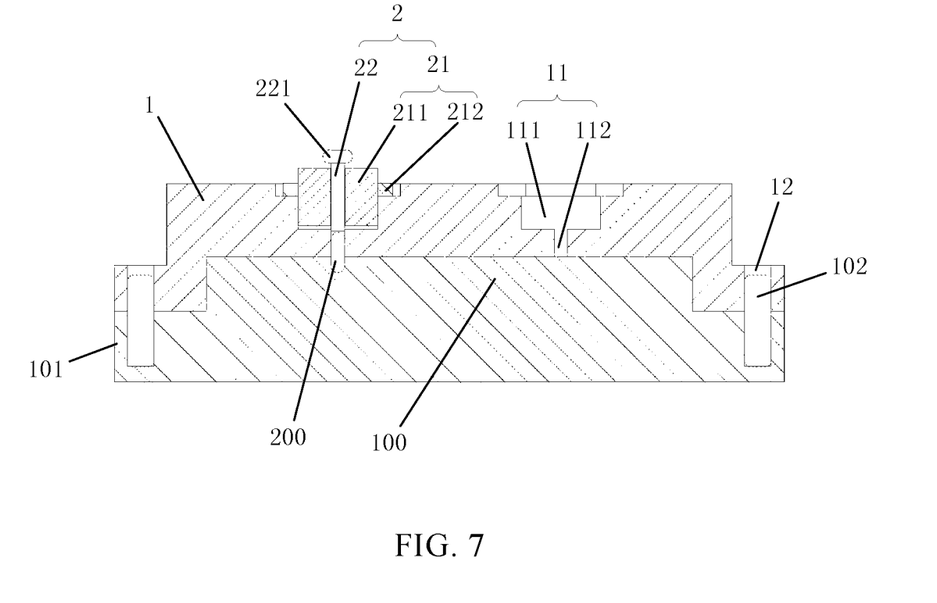
FIG. 7 is a cross-sectional view of A-A in FIG. 1 according to another exemplary embodiment.

FIG. 7 shows a cross-sectional view of A-A in FIG. 1 according to another exemplary embodiment. In this embodiment, the installation hole 11 includes a first part 111 with a first hole diameter and a second part 112 with a second hole diameter; the first hole diameter is adapted to the outer diameter of the measuring device 21, and the second hole diameter is adapted to the diameter of the pressing rod 22. In an installation state, the second part 112 is close to the electrostatic chuck 100. During use, the measuring device 21 is located in the first part 111, and the pressing rod 22 passes through the through hole 210 of the measuring device 21 and then enters the second part 112 to perform fixed depth press installation of the needle 200.

In this embodiment, the positioning tray 1 may be installed first, then the needles 200 to be installed are put into the second parts 112 of the installation holes 11 one by one, the measuring depth of the measuring device 21 is adjusted, the measuring device 21 is placed in the first part 111 of the installation hole 11, the pressing rod 22 passes through the measuring device 21 and is pressed toward the second part 112 of the installation hole 11, and then the needle 200 put into the second part 112 of the installation hole 11 is installed at a fixed depth.

In the embodiment of the present disclosure, in order to control the pressing depth of the pressing rod 22, the pressing rod 22 includes a handle 221, and the outer diameter of the handle 221 is greater than the diameter of the through hole 210. The pressing range of the pressing rod 22 is controlled by the handle 221 that will not be pressed into the through hole 210, so as to control the pressing depth of the pressing rod 22 in combination with the measuring depth of the measuring device 21, and accurately control the installation depth of the needle 200.

In order to fully press and install the needle 200, the height of the pressing rod 22 is greater than that of the measuring device 21 to ensure that the end of the pressing rod 22 can extend into the second part 112 to press the needle 200.

In the technical solution of the present disclosure, the safety and accuracy of pressing and installing the needle 200 by the pressing rod 22 depends on the positioning accuracy of the positioning tray 1. Referring back to FIGS. 1, 2, and 7, at least two positioning pins 102 are disposed on the outer base 101 of the electrostatic chuck 100, the positioning tray 1 is provided with at least two positioning holes 12, the positioning holes 12 correspond to the positioning pins 102 in number and position, the positioning holes 12 of the positioning tray 1 and the positioning pins 102 on the outer base 101 of the electrostatic chuck 100 are installed in one-to-one correspondence. The positioning tray 1 is positioned and installed by means of the positioning holes 12 and the positioning pins 102, then the installation holes 11 on the positioning tray 1 are accurately positioned, and the purpose of accurately installing the needles 200 is achieved.

In some embodiments, during the matching and installing of the positioning holes 12 and the positioning pins 102, in order to prevent the positioning holes 12 and the positioning pins 102 from being misaligned and installed, and to avoid the deviation of the installation positions of the installation holes 11 and the needles 200, reference may be made to a direction mark (not shown) on the electrostatic chuck 100, the positioning tray 1 is provided with an orientation mark 13, and the orientation mark 13 matches the direction mark on the electrostatic chuck 100.

In the actual installing process, the orientation mark 13 on the positioning tray 1 is aligned with the direction mark on the electrostatic chuck 100, and then the positioning holes 12 and the positioning pins 102 are adapted and installed one by one to complete the installation of the positioning tray 1, thereby ensuring one-to-one alignment of the installation holes 11 on the positioning tray 1 with the installation positions of the needles 200 on the electrostatic chuck 100, effectively improving the installation efficiency and the accuracy of the needles 200, and avoiding low installation efficiency caused by the misalignment of the positioning tray 1.

Corresponding to the above-mentioned installation fixture for needle, an embodiment of the present disclosure further provides an installation method for needle, which is implemented by the installation fixture for needle described above. The operation process is as follows:

The positioning tray 1 is installed on the outer base 101 of the electrostatic chuck 100;

The installation height of the installation fixture 2 is adjusted to a preset value, and the installation fixture 2 is placed in an installation hole 11 of the positioning tray 1 to install a needle 200.

During the installation of the positioning tray 1, the positions of the installation holes 11 on the positioning tray 1 need to correspond to the installation positions of the needles 200 on the electrostatic chuck 100 on a one-to-one basis, so that the needles 200 are installed one by one by the installation fixture 2.

Adjusting the installation height of the installation fixture 2 to a preset value includes: adjusting the measuring depth of the measuring device 21 to a preset value. In some embodiments, adjusting the measuring depth of the measuring device 21 to a preset value includes: adjusting the measuring block 212 to a predetermined position on the measuring rod 211.

After the measuring block 212 is adjusted to the predetermined position (scale line) on the measuring rod 211, the measuring rod 211 is put into the installation hole 11, and then the pressing rod 22 passes through the through hole 210 to press the needle 200 corresponding to the installation hole 11 for fixed depth installation.

In the installation method for needle of the present disclosure, installing the positioning tray 1 on the outer base 101 of the electrostatic chuck 100 includes: correspondingly installing the positioning holes 12 of the positioning tray 1 to the positioning pins 102 on the electrostatic chuck 100. During this process, it is necessary to ensure that each installation hole 11 on the positioning tray 1 corresponds to the installation position of each needle 200 on the electrostatic chuck 100.

In order to improve the installation efficiency and avoid the situation that the installation holes 11 do not correspond to the installation positions of the needles 200, in the embodiment of the present disclosure, before the positioning holes 12 of the positioning tray 1 and the positioning pins 102 on the electrostatic chuck 100 are installed correspondingly, the method further includes: aligning the orientation mark 13 on the positioning tray 1 with the direction mark on the electrostatic chuck 100.

The embodiments or implementations in this specification are described in a progressive manner, each embodiment focuses on the differences from other embodiments, and the same or similar parts between the various embodiments may be referred to each other.

In the description of this specification, the descriptions with reference to the terms "embodiment", "exemplary embodiment", "some implementations", "schematic implementation", "example", etc. mean that specific features, structures, materials or characteristics described in conjunction with the embodiments or examples are included in at least one embodiment or example of the present application.

In this specification, the schematic descriptions of the above terms do not necessarily refer to the same embodiment or example. Moreover, the described specific features, structures, materials or characteristics may be combined in an appropriate manner in any one or more embodiments or examples.

In the description of the present disclosure, it should be noted that the orientations or positional relationships indicated by the terms "center", "upper", "lower", "left", "right", "vertical", "horizontal", "inner", "outer", etc. are based on the orientations or positional relationships shown in the accompanying drawings, and are intended to facilitate the description of the present disclosure and simplify the description only, rather than indicating or implying that the device or element referred to must have a particular orientation or be constructed and operated in a particular orientation, and will not to be interpreted as limiting the present disclosure.

It can be understood that the terms "first", "second", etc. used in the present disclosure can be used in the present disclosure to describe various structures, but these structures are not limited by these terms. These terms are only used to distinguish the first structure from another structure.

In one or more drawings, the same elements are represented by similar reference numerals. For the sake of clarity, various parts in the drawings are not drawn to scale. In addition, some well-known parts may not be shown. For the sake of brevity, the structure obtained after several steps can be described in one figure. Many specific details of the present disclosure are described below, such as the structure, material, dimension, treatment process and technology of devices, in order to understand the present disclosure more clearly. However, as those skilled in the art can understand, the present disclosure may not be implemented according to these specific details.

Finally, it should be noted that the above embodiments are merely used to describe, but not to limit, the technical solutions of the present disclosure. Although the present disclosure is described in detail with reference to the above embodiments, those of ordinary skill in the art should understand that various modifications may be made to the technical solutions described in the foregoing embodiments, or equivalent substitutions may be made to some or all technical features thereof, and these modifications or substitutions do not make the essences of the corresponding technical solutions depart from the scope of the technical solutions of the embodiments of the present disclosure.

INDUSTRIAL APPLICABILITY

The installation fixture for needle according to the embodiments of the present disclosure is used to install the needles of the electrostatic chuck, ensures the smooth installation and installation efficiency of the needles, can accurately adjust the installation depths of the needles, ensures the consistency of the installation depths of the needles, ensures the position stability of a semiconductor device supported by the needles, avoids machining errors or scraps, and improves the yield of production.

What is claimed is:

1. An installation fixture for needle, being used to install needles of an electrostatic chuck, and comprising:
    a positioning tray, detachably disposed on an outer base of the electrostatic chuck, the positioning tray being provided with installation holes, and the installation holes corresponding to installation positions of the needles of the electrostatic chuck; and
    an installation fixture, detachably installed in the installation hole to adjust an installation depth of the needle.

2. The installation fixture for needle according to claim 1, wherein the installation fixture comprises:
    a measuring device, detachably installed in the installation hole, the measuring device comprising a through hole; and
    a pressing rod, configured in the through hole, to adjust the installation depth of the needle according to a height of the pressing rod and an relative height between the pressing rod and the measuring device.

3. The installation fixture for needle according to claim 2, wherein the measuring device comprises:
    a measuring rod, detachably installed in the installation hole, the measuring rod comprising the through hole; and
    a measuring block, connected with the measuring rod in a transmission way, wherein a relative position between the measuring block and the measuring rod is adjusted to adjust a relative height between the pressing rod and the measuring device.

4. The installation fixture for needle according to claim 3, wherein the measuring block is sleeved on the measuring rod, and an outer diameter of the measuring block is greater than a diameter of the installation hole.

5. The installation fixture for needle according to claim 3, wherein the measuring rod is provided with scale lines.

6. The installation fixture for needle according to claim 4, wherein the measuring rod is a screw, and the measuring block is a nut.

7. The installation fixture for needle according to claim 2, wherein the installation hole comprises a first part with a first hole diameter and a second part with a second hole diameter; the first hole diameter is adapted to an outer diameter of the measuring device, and the second hole diameter is adapted to a diameter of the pressing rod;

the second part is close to the electrostatic chuck.

8. The installation fixture for needle according to claim 3, wherein the pressing rod comprises a handle, and an outer diameter of the handle is greater than a diameter of the through hole.

9. The installation fixture for needle according to claim 2, wherein a height of the pressing rod is greater than a height of the measuring device.

10. The installation fixture for needle according to claim 1, wherein the positioning tray is provided with at least two positioning holes, at least two positioning pins are disposed on the outer base of the electrostatic chuck, and the positioning holes correspond to the positioning pins.

11. The installation fixture for needle according to claim 1, wherein the positioning tray is provided with an orientation mark, and the orientation mark is adapted to a direction mark on the electrostatic chuck.

12. An installation method for needle, being implemented by an installation fixture for needle;

wherein, the installation fixture for needle comprises:

a positioning tray, detachably disposed on an outer base of the electrostatic chuck, the positioning tray being provided with installation holes, and the installation holes corresponding to installation positions of the needles of the electrostatic chuck; and an installation fixture, detachably installed in the installation hole to adjust an installation depth of the needle;

the installation method for needle comprises:

installing the positioning tray on the outer base of the electrostatic chuck; and adjusting the installation height of the installation fixture to a preset value, and placing the installation fixture in an installation hole of the positioning tray to install a needle.

13. The installation method for needle according to claim 12, wherein the adjusting the installation height of the installation fixture to a preset value comprises:

adjusting the measuring block to a predetermined position on the measuring rod.

14. The installation method for needle according to claim 12, wherein the installing the positioning tray on the outer base of the electrostatic chuck comprises:

correspondingly installing the positioning holes of the positioning tray to the positioning pins on the electrostatic chuck.

15. The installation method for needle according to claim 14, wherein before correspondingly installing the positioning holes of the positioning tray to the positioning pins on the electrostatic chuck, the installation method for needle further comprises:

aligning the orientation mark on the positioning tray with the direction mark on the electrostatic chuck.

* * * * *